(12) United States Patent
Seminara et al.

(10) Patent No.: US 10,151,026 B2
(45) Date of Patent: Dec. 11, 2018

(54) VIBRATION ASSISTED DENSIFICATION OF A CARBON FIBER PREFORM

(71) Applicant: Honeywell International Inc., Morris Plains, NJ (US)

(72) Inventors: Gary J. Seminara, Wonder Lake, IL (US); Richard George Rateick, Jr., South Bend, IN (US)

(73) Assignee: Honeywell International Inc., Morris Plains, NJ (US)

( * ) Notice: Subject to any disclaimer, the term of this patent is extended or adjusted under 35 U.S.C. 154(b) by 191 days.

(21) Appl. No.: 15/229,982

(22) Filed: Aug. 5, 2016

(65) Prior Publication Data

US 2018/0037988 A1 Feb. 8, 2018

(51) Int. Cl.
| | |
|---|---|
| *B32B 19/00* | (2006.01) |
| *C23C 16/04* | (2006.01) |
| *B64C 25/42* | (2006.01) |
| *C04B 35/622* | (2006.01) |
| *C04B 35/628* | (2006.01) |
| *C04B 35/64* | (2006.01) |
| *C04B 35/80* | (2006.01) |
| *C04B 35/83* | (2006.01) |
| *C23C 16/56* | (2006.01) |

(52) U.S. Cl.
CPC ............ *C23C 16/045* (2013.01); *B64C 25/42* (2013.01); *C04B 35/62204* (2013.01); *C04B 35/62844* (2013.01); *C04B 35/64* (2013.01); *C04B 35/80* (2013.01); *C04B 35/806* (2013.01); *C04B 35/83* (2013.01); *C23C 16/56* (2013.01); *C04B 2235/422* (2013.01); *C04B 2235/48* (2013.01); *C04B 2235/5248* (2013.01); *C04B 2235/612* (2013.01); *C04B 2235/616* (2013.01)

(58) Field of Classification Search
CPC ...................................................... B32B 19/00
See application file for complete search history.

(56) References Cited

U.S. PATENT DOCUMENTS

| | | | |
|---|---|---|---|
| 4,252,588 | A | 2/1981 | Kratsch et al. |
| 4,659,444 | A | 4/1987 | Iwata et al. |
| 4,772,502 | A * | 9/1988 | Okura ............. C04B 35/83 428/293.4 |

(Continued)

FOREIGN PATENT DOCUMENTS

| | | |
|---|---|---|
| FR | 2611086 A2 | 8/1988 |
| JP | H0415397 A | 1/1992 |

OTHER PUBLICATIONS

Response to Extended Search Report dated Jan. 3, 2018, from counterpart European Application No. 17181320.7, filed Apr. 26, 2018, 7 pp.

(Continued)

*Primary Examiner* — Andrew T Piziali
(74) *Attorney, Agent, or Firm* — Shumaker & Sieffert, P.A.

(57) ABSTRACT

The disclosure describes in some examples a technique that includes the disclosure describes a technique that includes depositing a carbon powder and a resin powder on a surface of a fiber preform, where the fiber preform includes a plurality of fibers and defines interstitial spaces between the plurality of fibers, and vibrating the fiber preform to allow the carbon powder and the resin powder to infiltrate the interstitial spaces between the plurality of fibers of the fiber preform to form an infiltrated preform.

15 Claims, 4 Drawing Sheets

(56) References Cited

U.S. PATENT DOCUMENTS

| | | | |
|---|---|---|---|
| 5,352,484 A | | 10/1994 | Bernard et al. |
| 6,127,290 A | * | 10/2000 | Koiso .................. A43B 7/04 |
| | | | 442/72 |
| 2008/0081757 A1 | | 4/2008 | Murata et al. |
| 2012/0108698 A1 | * | 5/2012 | Lam .................. F16D 69/026 |
| | | | 523/156 |

OTHER PUBLICATIONS

Examination Report from counterpart European Application No. 17181320.7, dated Jan. 3, 2018, 8 pp.

Gang et al., "Stabilization and carbonization properties of mesocarbon microbeads (MCMB) prepared from a synthetic naphthalene isotropic pitch," Carbon 37, Pergamon, Oct. 3, 1998, 8 pp.

Dekeyrel et al., "Characterization of carbon/carbon composites prepared by different processing routes including liquid pitch densification process," Composites Part A: 49, El Sevier, Science Direct, Feb. 26, 2013, 8 pp.

* cited by examiner

VIBRATION ASSISTED DENSIFICATION OF A CARBON FIBER PREFORM

TECHNICAL FIELD

The disclosure relates to the carbon-carbon composite materials, such as the manufacture of aircraft brake discs made of carbon-carbon composite materials.

BACKGROUND

Carbon-carbon composite materials are composite materials that include a matrix including carbon reinforced with carbon fibers. Carbon-carbon (C—C) composite components can be used in many high temperature applications. For example, the aerospace industry employs C—C composite components as friction materials for commercial and military aircraft, such as brake friction materials.

Some carbon-carbon composites, such as some carbon-carbon composite brake discs that are used in the aerospace industry, may be manufactured from carbon fiber preforms that include layers of carbon fibers, which may be densified using one or more of several processes, including chemical vapor deposition/chemical vapor infiltration (CVD/CVI), vacuum/pressure infiltration (VPI), or resin transfer molding (RTM), to infiltrate the fiber preform with carbon or carbon precursor material.

SUMMARY

In some examples, the disclosure describes a technique that includes depositing a carbon powder and a resin powder on a surface of a fiber preform, where the fiber preform includes a plurality of fibers and defines interstitial spaces between the plurality of fibers, and vibrating the fiber preform to allow the carbon powder and the resin powder to infiltrate the interstitial spaces between the plurality of fibers of the fiber preform to form an infiltrated preform.

In some examples, the disclosure describes a technique that includes machining an exterior surface of a carbon-carbon composite to form a carbon powder, mixing the carbon powder with a resin powder to form a powder mixture, and infiltrating interstitial spaces between fibers of a fiber preform by depositing the powder mixture on a surface of the fiber preform and vibrating the fiber preform.

In some examples, the disclosure describes an infiltrated fiber preform including a fiber preform including a plurality of fibers that define interstitial spaces between the plurality of fibers and a powder mixture in the interstitial spaces between the plurality of fibers, wherein the powder mixture comprises a carbon powder and a resin powder.

The details of one or more examples of the disclosure are set forth in the accompanying drawings and the description below. Other features, objects, and advantages of the disclosure will be apparent from the description and drawings, and from the claims.

DETAILED DESCRIPTION

The present disclosure describes techniques for densifying a fiber preform used to form a carbon-carbon (C—C) composite that may be used, for example, to form a disc brake. The described fiber preforms may include a plurality of layers of carbon fibers. As will be described herein, in some examples, an example technique may include depositing a dry particle mixture including a carbon powder and a resin powder on an exterior surface of the fiber preform. The dry particle mixture may then be infiltrated into the inner recesses of the fiber preform (e.g., the interstitial spaces between fibers of the fiber preform) using an applied vibration assisted by gravity to form an infiltrated preform.

Figure 1A:
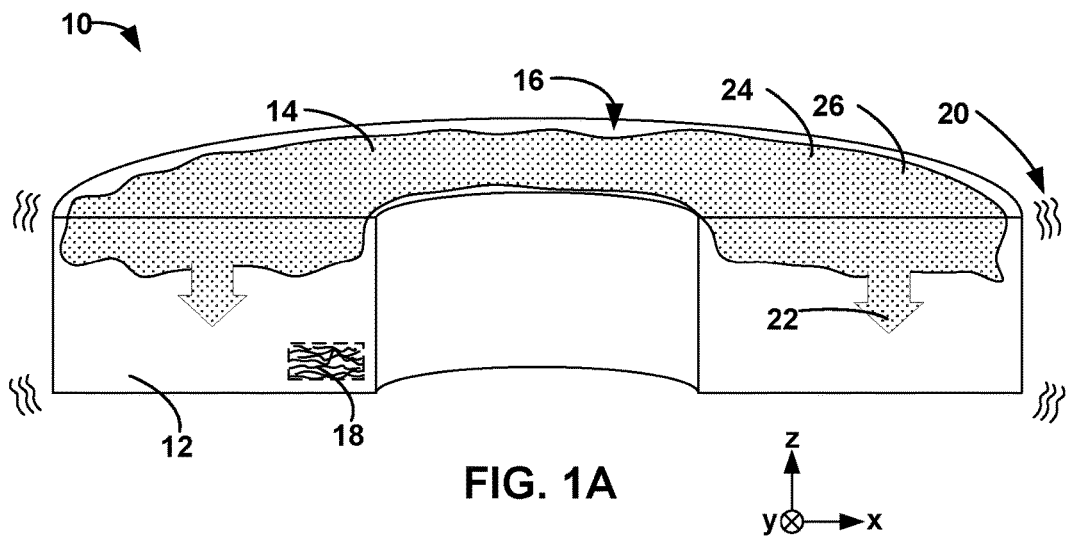
FIG. 1A is a schematic perspective, cross-sectional view of an example article that includes a fiber preform at least partially infiltrated with a carbon powder and a resin powder.

FIG. 1A is a schematic perspective, cross-sectional view of an example article 10 that includes a fiber preform 12 that may be used to manufacture a densified carbon-carbon composite. As shown, article 10 includes a carbon powder 24 and a resin powder 26 in substantially dry form (e.g., absent or with minimal amounts of solvent or liquid carrier material) deposited on an exterior surface 16 of fiber preform 12. FIG. 1A also conceptually illustrates the application of a vibrational force 20 to fiber preform 12 that causes at least some of powder mixture 14 to infiltrate into the inner recesses of fiber preform 12 (e.g., the interstitial spaces between the plurality of fibers of the fiber preform 12).

In some examples, carbon powder 24 and resin powder 26 may be combined to form powder mixture 14. As used herein, the term "powder" is used to denote a collection of fine, loose particles in dry form, e.g., without the presence of a solvent or liquid carrier fluid. In some examples, powder mixture 14 may be mixed prior to being deposited on fiber preform 12 to ensure homogeny of the mixture.

Resin powder 26 may include any suitable precursor matrix material reduced to particle form. Examples of suitable resin materials used to form resin powder 26 may include thermoset resins including, for example, furan, phenolic (e.g., diphenyletherformaldehyde), polyimide, or the like; thermoplastic resins including, for example, coal tar, petroleum, or synthetic pitch, polyetheretherketone (PEEK), polyethylenimine (PEI), polybenzimidazole (PBI), polyarylacetylene, or the like. While some resins (e.g., coal tar or petroleum pitch) may be classified as a high viscosity liquid in some examples, for purposes of this application, the resin may be considered a powder material due to the fact the resin may be processed (e.g., mechanically ground) into a particle (e.g., powder form).

In some examples, resin powder 26 may include predominately coal tar or petroleum pitch. In such examples, the coal tar or petroleum pitch may be supplied in pellet form, that may be further processed to reduce the size of the resin particles to a desired mesh size (e.g., mechanically grinding the pellets to a desired size that best allows passage of the resultant particles through preform). In some examples, such processing may occur during the mixing of carbon powder 24 and resin powder 26. For example, the resin pellets may be combined with carbon power 24 and the entire mixture may be mechanically ground to from powder mixture 14 that includes carbon powder 24 and resin powder 26 that collectively exhibit an overall desired mesh size. In some examples, mixing carbon powder 24 and resin powder 26 together to produce powder mixture 14 may help reduce or prevent resin powder 26 from unintentionally clumping prior to infiltration. In some examples, the resin material used to form resin powder 26 may be processed (e.g., mechanically ground) in close temporal proximity to being infiltrated into fiber preform 12 to help reduce the amount of resin material that may undergo oxidation prior to being infiltrated. In some examples, the resin material used to form resin powder 26 may be processed within about 24 hours of being infiltrated into fiber preform 12.

Figure 2:
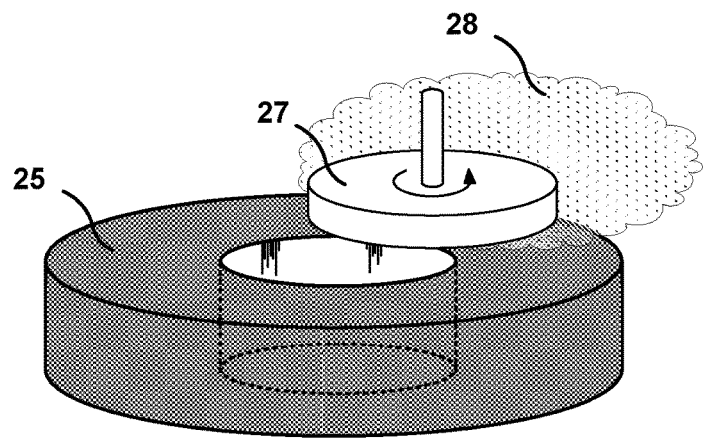
FIG. 2 is a schematic illustration of an example C—C composite component being subjected to a machining process, thereby producing carbon milling waste as a byproduct.

Carbon powder 24 may include any suitable carbon material including, for example, carbon black, graphite, grounded carbon whiskers, or the like. In some examples, at least some of carbon powder 24 may be provided from recycled milling waist of a C—C composite or intermediate (e.g., carbonized) component. For example, during the production of some carbon-carbon (C—C) composite components, such as those used to form an aircraft disc brake, a carbon fiber preform may be subjected to one or more cycles of densification/infiltration (e.g., resin infiltration via resin transfer molding (RTM)) and pyrolysis/carbonization followed by graphitization (e.g., heat treatment) to produce a final C—C composite component that exhibits a sufficiently high density (e.g., greater than about 1.7 grams per cubic centimeter (g/cm$^3$)) depending on the intended purpose for the C—C composite component. In some examples, the densification/infiltration and pyrolysis/carbonization process may occlude some of the pores or interstitial spaces of the preform thereby reducing or hindering the influx of additional densifying material into the composite preform. The composite preform may be machined (e.g., milling, turning, drilling, grinding, or the like) to reopen some of the interstices (e.g., interstitial spaces between the plurality of fibers of the fiber preform 12) of the composite preform in order to allow for additional densifying material to be incorporated into the composite preform thereby resulting in the production of carbon milling waste. Additionally or alternatively, after the final graphitization process (e.g., heat treatment), the resultant C—C composite component may be subjected to additional machining to shape the C—C composite component within desired specifications. In some examples, the machining process removes excess carbon material (e.g., carbon milling waste) that may require special handling precautions for the material to be properly disposed. FIG. 2 is a schematic illustration of an example C—C composite component 25 (e.g., infiltrated fiber preform 12 after carbonization or graphitization) being subjected to a machining process 27, thereby producing carbon milling waste 28 as a byproduct.

In some examples the carbon milling waste 28 may be used to form at least a portion of carbon powder 24. In some such examples, the incorporation of carbon milling waste 28 in carbon powder 24 may provide several economic and environmental advantages by, for example, reducing the overall amount of carbon milling waste 28 produced per C—C composite component 25 by recycling at least a portion of the waste material back into the production line of the C—C composites. In some examples, the carbon milling waste 28 may account to substantially all (e.g. all or nearly all) of carbon powder 24 incorporated in powder mixture 14.

In some examples, the carbon milling waste 28 may be processed prior to being added to powder mixture 14. For example, the carbon milling waste 28 may be screened to provide a carbon powder 24 of a desired size. In some examples, the carbon milling waste 28 produced after the C—C composite has been substantially graphitized (e.g., carbon produced after heat treatment) may be used to form at least part of carbon powder 24 and powder mixture 14. In some examples, the carbon milling waste 28 produced after the C—C composite has been substantially graphitized may exhibit a higher purity content of carbon compared to the carbon milling waste 28 generate during other parts of the C—C composite processing.

In some examples, powder mixture 14 (e.g., carbon powder 24 and resin powder 26) may have a mesh size selected to allow powder mixture to infiltrate fiber preform 12. The selection of mesh size may depend on the properties of the fiber preform 12 (e.g., size of interstitial spaces 19), orientation of the interstitial channels within the preform (e.g., whether substantially vertical or horizontal with respect to gravity), and the magnitude of the vibrational forces applied to facilitate infiltration. The distribution of the mesh size of powder mixture 14 may be of any suitable configuration including, for example, uniform distribution, bimodal distribution, multi-modal distribution, non-uniform distribution, or the like. In some examples, the mesh size of carbon powder 24 and resin powder 26 may be selected to be substantially the same (e.g., the same or nearly the same). In some examples, powder mixture 14 may include a mesh size greater than about 18 (e.g., defining particle diameters of less than about 1 millimeter).

Powder mixture 14 may include any suitable amount of resin powder 26 and carbon powder 24. In some examples, powder mixture 14 may include least 10 weight percent (wt. %) carbon powder 24. In some examples, powder mixture 14 may include higher amounts of carbon powder 24 (e.g., 25 wt. %) depending on the selection of resin material used to form resin powder 26.

Figure 1B:
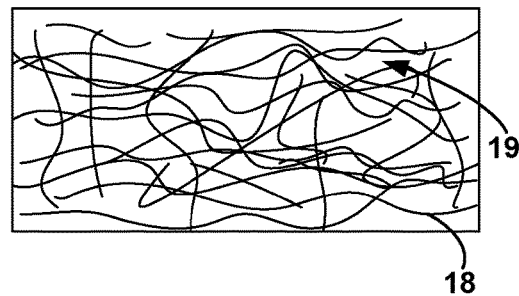
FIG. 1B is a close-up schematic cross-sectional view of the fiber preform of FIG. 1A.
Figure 3:
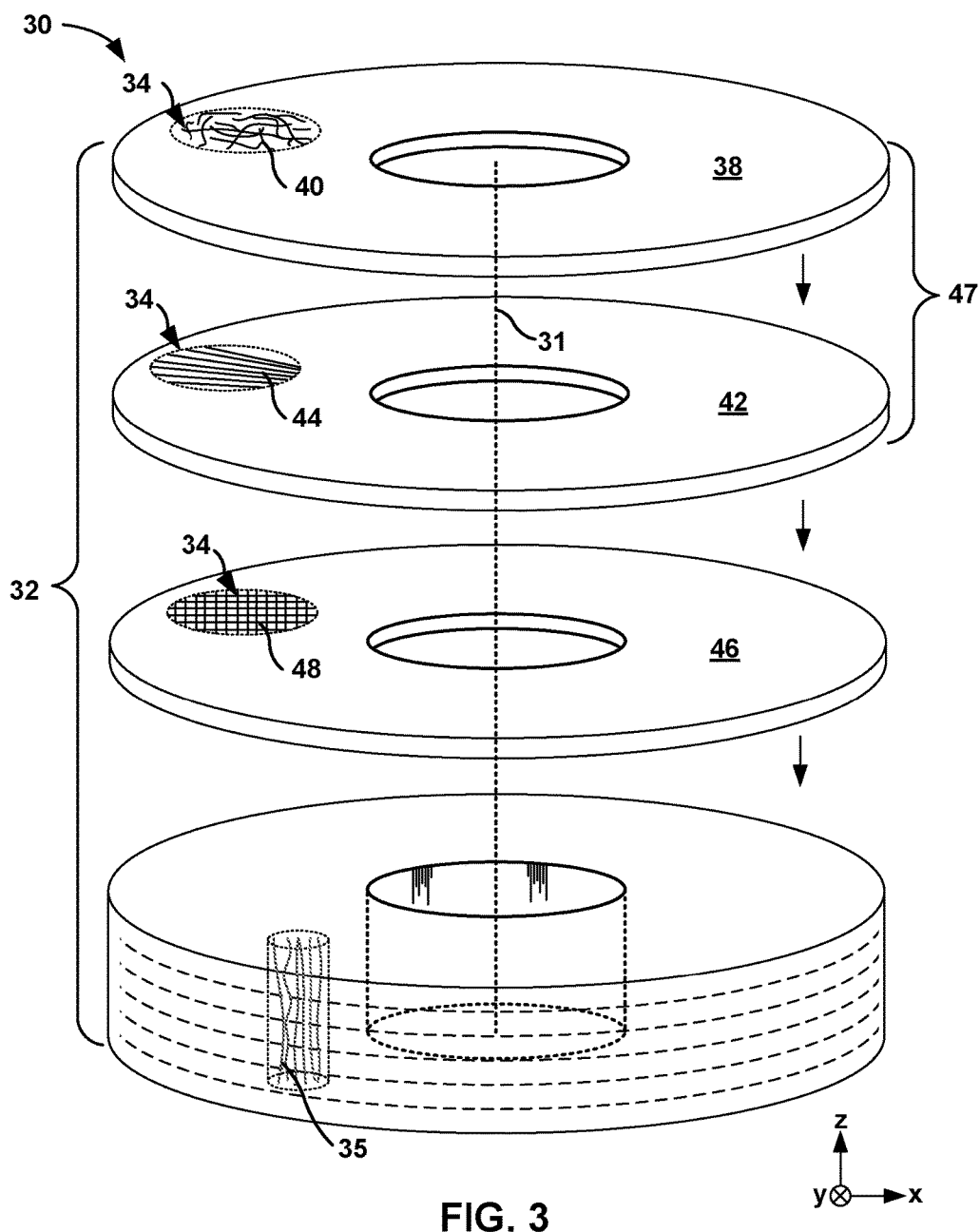
FIG. 3 is a schematic of an exploded perspective view of an example fiber preform formed from a plurality of layers of carbon fiber or carbon precursor fibers.

Fiber preform 12 may include a plurality of fibers 18 (e.g., carbon fibers or carbon precursor fibers) that define the interstices (e.g., the interstitial spaces between the plurality of fibers of the fiber preform 12) of fiber preform 12. FIG. 1B is a close-up schematic cross-sectional view of fiber preform 12 of FIG. 1A showing plurality of fibers 18 as well as the interstitial spaces 19 defined between fibers 18. Fibers 18 may be combined to using any suitable technique to form fiber preform 12. For example, FIG. 3 shows a schematic of an exploded perspective view of an example fiber preform 30 formed from a plurality of layers 32 of carbon fiber or carbon precursor fibers (collectively fibers 34) combined to form the body of fiber preform 30.

In some examples, plurality of layers 32 may include one or more web layers 38, tow layers 42, woven layers 46, or combinations thereof, each including fibers 34. In some examples, web layers 38 may include web fibers 40, which may include relatively short, chopped, and entangled fibers of fibers 34. Tow layers 42 may include one or more tows 44 of fibers 34 arranged in any suitable arrangement including, for example, linear, radial (e.g., radial orientation with respect to a disc shape), chordal, or the like. Woven layers 36 may include a plurality of woven fibers 48. In some example, woven fibers 48 may include tows of fibers 34 woven together (e.g. tows woven in waft and weft directions).

In some examples, plurality of layers 32 may include a tow layer 42 and web layer 38 combined to form duplex layer 47 of fibers 34. In some such examples, duplex layer 47 may be formed by combining one or more tow layers 42 with one or more web layers 38. For example, web layer 38 may be needled to a tow layer 42 to form duplex layer 47. The needling process may cause some of the web fibers 40 to partially transfer into tow layer 42 to join web layer 38 to tow layer 42 together. Web fibers 40 that partially transfer into tow layer 42 may form needled fibers 35 (e.g., fibers that generally align with stack axis 31 and extent into two or more of layers 32).

As used herein the term "layer" of fibers 34 is not intended to be limited to one particular type of layer (e.g. web layer 38, tow layer 42, woven layer 46, duplex layer 47, or the like) and may include configurations where one or more layers are combined together (e.g., duplex layer 47). In some examples, each layer 32 of fibers 34 may have a thickness as measured in a direction parallel (e.g., parallel or nearly parallel) to stack axis 31 of about 1 millimeter (mm) to about 2 mm, which are stacked to produce fiber preform 30 having a desired thickness (e.g., along z-axis of FIG. 1A). In some examples the thickness may be substantially uniform (e.g., uniform or nearly uniform).

In some examples, increasing the number of needled fibers 35 included in fiber preform 30 may increase the z-axis reinforcement of the resultant C—C composite component 25. However, while the z-axis reinforcement may be increased by increasing the quantity of needled fibers 35, the process and presence of needled fibers 35 may negatively impact the durability of the resultant C—C composite component 25 by increasing the presence of unintended defects in the fiber preform 30, which can result in, for example, the formation and propagation of cracks throughout the C—C composite component 25, increased migration of contaminates, increased oxidation degradation, or the like. In some examples, by using the densification/infiltration techniques describe herein, additional acicular material may be incorporated into fiber preform 30 by powder mixture 14 to provide additional z-axis reinforcement properties to the resultant C—C composite component. In some examples, the infiltration of powder mixture 14 into the inner recesses of fiber preform 30 may allow the quantity of needled fibers 35 to be reduced without significantly reducing the z-axis reinforcement properties to the resultant C—C composite component.

In some examples, layers 32 may include high areal weight fiber layers (fabric) of carbon or carbon precursor fibers 34 including, for example, polyacrylonitrile (PAN), oxidized polyacrylonitrile (O-PAN), rayon, or the like. In some examples, layers 32 may be formed to have an areal basis weight between about 1250 and about 3000 grams per square meter (g/m$^2$) such as, between about 1350 and about 2000 g/m$^2$. In some examples, forming layers 32 including high areal weight fiber layers (fabric), e.g., O-PAN fibers, may help increase the areal basis weight of plurality of layers 32, while maintaining an open construction which (e.g., low fiber volume), as discussed further below, may help improve processing times and efficiency as well as reduce operation costs. In some examples, by increasing areal basis weight of layers 32 using high areal weight fiber layers (fabric) may require less needling to join the respective layers 32 together while also establishing a more open fiber preform 30 with wider and deeper channels which are more easily infiltrated with powder mixture 14 compared to other stacks with smaller or narrower channels, without substantially reducing the density of fiber preform 30 compared to stacks and preforms made with lower areal basis weight fibers. In some examples, preform 30 may define an average the fiber volume of about 40 percent by volume (vol. %) to about 70 vol. % (e.g., corresponding to a free/void space volume of about 60 vol. % to 30 vol. %). In some examples the fiber volume of preform 30 may be about 65 vol. % to about 70 vol. %.

Fibers 34 may be constructed using any suitable material. In some examples fibers 34 may include carbon fibers. In other examples, fibers 34 may include carbon precursor fibers that may be subsequently converted to carbon fibers once the body of fiber preform 34 is constructed. Examples of suitable carbon precursor fiber materials may include, for example, PAN, O-PAN, cellulose (e.g., rayon), pitch, or the like. In some examples where fiber preform 30 is constructed with carbon precursor fibers, the preform may be subjected to an initial carbonization cycle to convert the carbon precursor fibers to carbon fibers prior to infiltration of fiber preform 30 with powder mixture 14.

As shown in FIG. 1A, in some examples, vibrational force 20 may vibrate fiber preform 12 relative to carbon powder 24 and resin powder 26, causing at least some of powder mixture 14 to infiltrated into the inner recesses (e.g., the interstitial spaces between the plurality of fibers of the fiber preform 12) of fiber preform 12 due to the vibrational and gravitational forces exerted on powder mixture 14 (e.g., gravitational force in the direction of arrow 22). The selected frequency and amplitude of vibrational force 20 may depend on the mesh size of powder mixture 14, fiber volume of preform 12, orientation of interstitial spaces 19 within preform 12, and the frictional characteristics between powder mixture 14 and preform 12. For example, vibrational force 20 exhibiting a relatively high frequency and/or amplitude may be applied to promote lateral (e.g., horizontal with respect to gravity) movement of powder mixture 14 within preform 12 where desired. While any suitable vibrational force 20 may be used, in some examples the vibrational force 20 (e.g., shaker table) may be characterized by a vibration frequency between about 25 hertz (Hz) and about 200 Hz, for example about 50 Hz. While there is no express upper limit for the frequency that may be applied, the selected frequency should remain low enough so as to not physically damage the fibers of preform 12 itself or cause powder mixture 14 to be ejected from preform 12.

In some examples, the combination of carbon powder 24 and resin powder 26 making up powder mixture 14 may provide several advantages compared to the utilization of either powder independently. For example, infiltrating fiber preform 12 with only resin powder 26 may not obtain a sufficient amount of carbon loading in fiber preform 12 to render vibration assisted infiltration a viable option compared to the carbon loading that may be obtained through other techniques (e.g., resin transfer molding). Infiltrating fiber preform 12 with only carbon powder 24 may require additional densification/infiltration processing to produce a functional matrix material. The presence of carbon powder 24 in combination with resin power may result in a sufficient amount of carbon loading and matrix material after infiltration and of fiber preform 12 followed by pyrolysis/carbonization. In some examples, a single cycle of powder mixture 14 vibration assisted infiltration and carbonization may result in a substantial increase in the density of fiber preform 12 (e.g., up to about a 100% weight increase). In some examples, the density of fiber preform 12 may be increased by about 5% to about 100%. Table 1 below provides representative weight increases obtained via applying a 50 Hz vibration to an example carbon fiber preforms

TABLE 1

Results of vibration infiltration experiments.

| | Fiber Preform ID No. | | | | | |
|---|---|---|---|---|---|---|
| | 40148-52 | 40148-59-1 | 40148-59-2 | 40148-063 | 40148-64 | 40148-65 |
| Initial weight (g) | 20.6 | 16.6 | 16.7 | 36.2 | 44.9 | 46.9 |
| Infiltrated weight after: | | | | | | |
| 5 min (g) | — | — | — | 37.8 | 46.3 | 48.1 |
| 10 min (g) | — | — | — | 38.2 | 47.1 | 49.4 |
| 15 min (g) | — | — | — | 38.4 | 47.0 | 49.7 |
| 20 min (g) | — | — | — | 38.6 | 47.1 | 50.2 |
| 25 min (g) | 31.0 | 30.7 | 24.6 | 38.5 | 47.4 | 50.8 |
| 30 min (g) | — | — | — | — | 47.4 | 50.6 |
| Total weight of infiltrated powder (g) | 10.3 | 14.1 | 8.0 | 2.3 | 2.6 | 3.6 |

In some examples, powder mixture, may substantially fill (e.g., completely fill or nearly completely fill) interstitial spaces 19 of preform 12. In some examples, powder mixture 14 may account for about 25 vol. % to about 60 vol. % of the infiltrated fiber preform.

In some examples, powder mixture 14 may account for at least about 5 weight percent (5 wt. %) of the infiltrated fiber preform. In some examples powder mixture 14 may account for about 25 wt. % to 50 wt. % of the infiltrated fiber preform.

Additionally or alternatively, infiltrating fiber preform 12 with dry powder mixture 14 by vibration assisted infiltration may offer several advantages compared to alternative infiltration/densification techniques. For example, vibration assisted infiltration may provide a relatively low cost infiltration technique compared to, resin transfer molding (RTM) which require complex molds, high pressure, and heat to infiltrate a fiber preform with resin material. Additionally, in examples where carbon powder 24 includes carbon milling waste 28, the techniques described herein may provide an opportunity to reduce capital overhead and waste production by providing a means for recycling carbon milling waste 28 back into the production line. Such recycling techniques may not be possible using other infiltration techniques including, for example, RTM due to the increased viscosity generated by the addition of carbon powder 24.

In some examples, at least some of powder mixture 14 may be electrostatically charged prior to being deposited on fiber preform 12. The applied electrostatic charge may reduce the production of dust (e.g., airborne powder mixture 14) generated during the vibration assisted infiltration process. Additionally or alternatively, the applied electrostatic charge may assist in adhering powder mixture 14 to fiber preform 12 during the intermediate processing.

In some examples, the electrostatic charge may be applied to only one of resin powder 26 or carbon powder 24 materials prior to mixing powder mixture 14. For example, the electrostatic charge may be applied to only carbon powder 24 and then thoroughly mixed with resin powder 26 to impart a charged to bulk powder mixture 14.

The electrostatic charge may be applied to powder mixture 14 using any suitable technique. For example, the electrostatic charge may be created by passing one or more of resin powder 26 and carbon powder 24 through a corona discharge to charge at least some of the particles prior to infiltrating the particles (e.g., powder mixture 14) into preform 12.

In some examples, an electrostatic charge, opposite of that applied to powder mixture 14 may be applied to fiber preform 12 using similar techniques. The opposite electrostatic charge on fiber preform 12 may increase the adhesion strength between powder mixture 14 and fiber preform 12.

Additionally or alternatively, fiber preform 12 may be coated with a-polylysine or similar compound. In some examples, the a-polylysine coating may be used to promote the adhesion between fiber preform 12 and powder mixture 14 as a result of the intrinsic charge of the powder itself.

In some examples, after fiber preform 12 has been infiltrated with powder mixture 14, the infiltrated preform (e.g., article 10 after infiltration is complete) may be heated to induce carbonization/pyrolysis of resin powder 26 to generate part of the matrix component of the final C—C composite component 25. In some examples, the infiltrated preform may be heated between about 550° C. and about −1500° C. depending on the type of resin used to induce carbonization/pyrolysis.

In some examples, the described vibration assisted powder mixture 14 infiltration techniques describe herein may lead to a more efficient densification process. For example, infiltration of a preform with pitch using vacuum pressure infiltration (VPI) or pitch transfer molding (RTM), followed by carbonization under ambient pressures may require an initial stabilization cycle of the pitch material between infiltration and carbonization. Such stabilization cycles may include waiting a sufficient amount of time to allow the pitch in the preform to undergo some degree of crosslinking, thereby inhibiting the pitch from leeching out of the preform during the subsequent carbonization process. The pitch stabilization cycle however can be extremely time intensive, requiring several months for the pitch to undergo sufficient crosslinking, and even with pitch stabilization, some amount of pitch may be forced out of the preform during carbonization because of gases evolved from the pitch as it is converted to matrix material.

In some examples, carbon powder 24 of powder mixture 14 may hinder the ability of the resin material to flow during the subsequent carbonization/pyrolysis process. The resistance of the resin material (e.g., resin powder 26) from being able to flow out of fiber preform 12 during the carbonization/pyrolysis process may significantly reduce or eliminate the amount stabilization needed to efficiently retain the resin material in the fiber preform 12 during the carbonization process as well as significantly reduce or eliminate the time sent stabilizing the infiltrated preform prior to carbonization.

In some examples, the vibration assisted infiltration techniques described herein may help reduce or eliminate the need to rigidify preform 12 using CVD/CVD, or the like, prior infiltrating preform 12 with powder mixture 14. In some examples, after performing the describe vibration assisted infiltration techniques, the infiltrated preform may be subsequently densified using, for example VPI, RTM, CVD/CVI, or the like.

Figure 4:
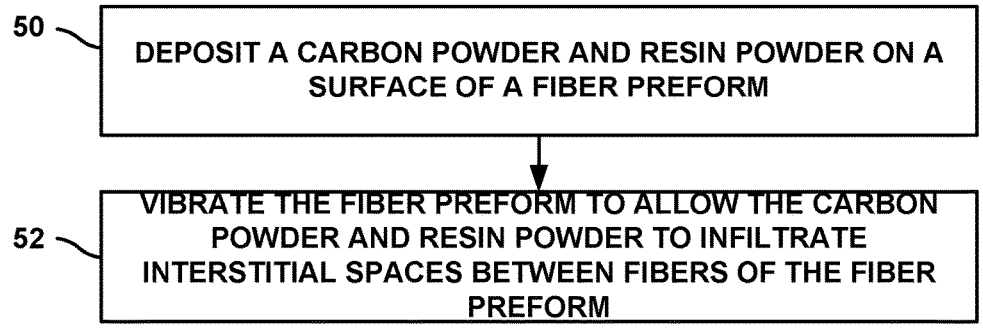
FIG. 4-6 are flow diagrams illustrating an example techniques of manufacturing an article such as the article of FIG. 1A.
Figure 5:
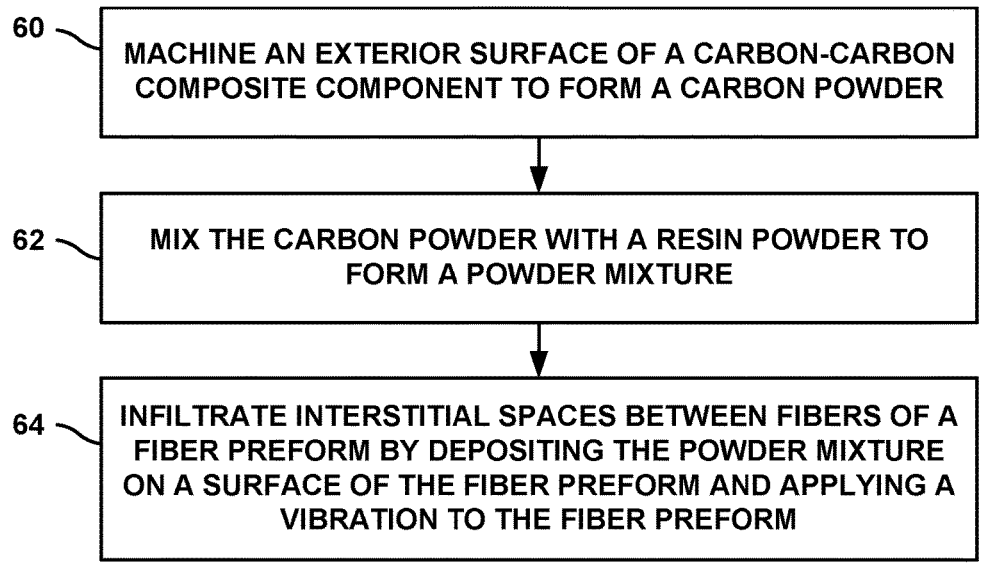
Figure 6:
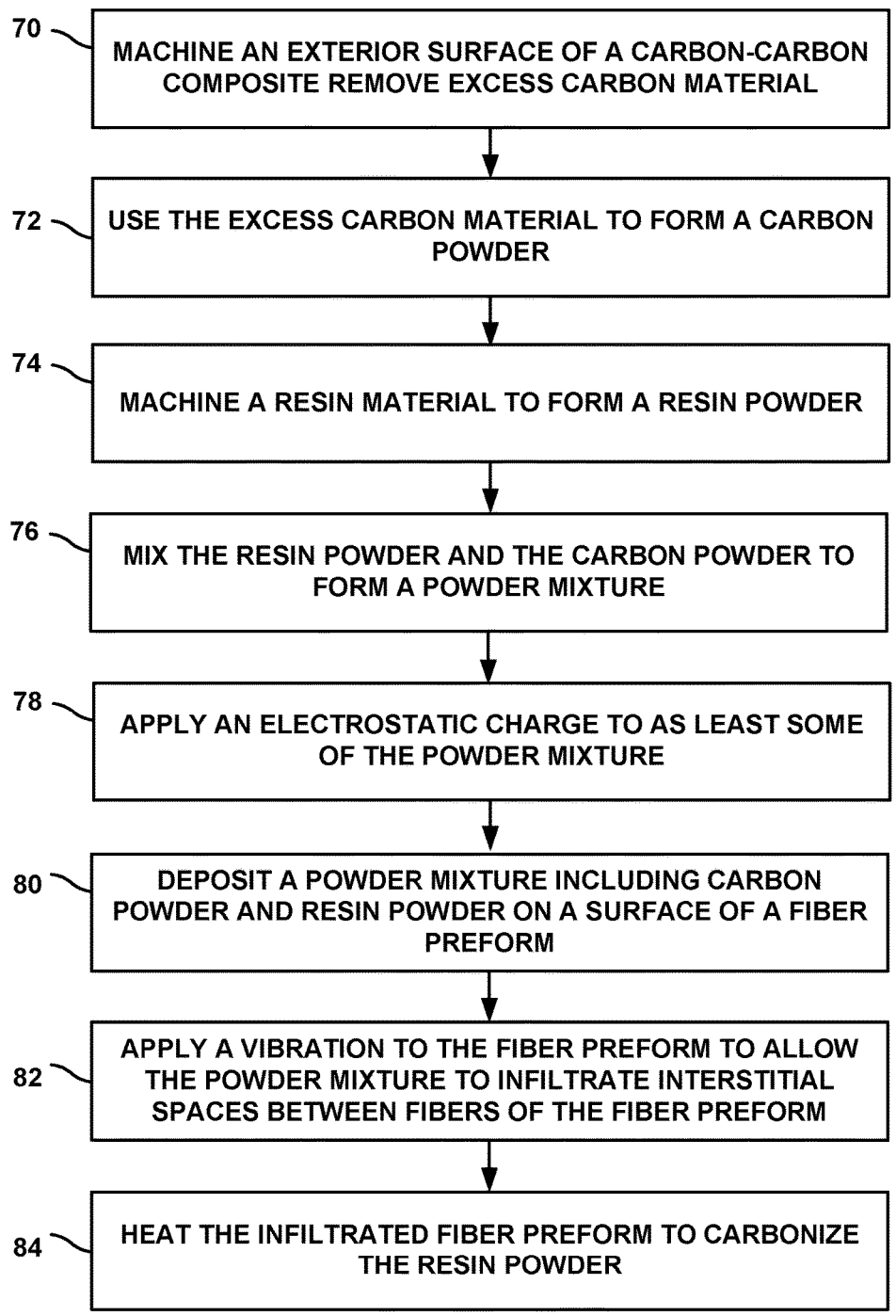

The infiltrated fiber preform described herein may be formed using any suitable technique. FIGS. 4-6 are flow diagrams illustrating example techniques of producing an infiltrated fiber preform. For ease of illustration, the example methods of FIGS. 4-6 are described with respect to the articles of FIGS. 1 and 2; however, articles may be formed using the described techniques and the articles of FIGS. 1 and 2 may be made using other techniques to similar those described in FIGS. 4-6.

The example technique of FIG. 4 includes depositing a carbon powder 24 and a resin powder 26 on a fiber preform 12 (50) and vibrating fiber preform 12 (e.g., using applied vibrational force 20) to allow carbon powder 24 and resin powder 26 to infiltrate interstitial spaces 19 of fiber preform 12 (52). As described above, in some examples carbon powder 24 and resin powder 26 may be mixed together to form powder mixture 14 prior to being deposited on fiber preform 12 to help maintain the homogeny of powder mixture 14 once infiltrated in fiber preform 12. Additionally or alternatively, carbon powder 24 and resin powder 26 may be deposited on fiber preform 12 in stages during the vibration assisted infiltration process to result in fiber preform 12 infiltrated with powder mixture 14.

Carbon powder 24 and resin powder 26 may comprise any suitable materials. For example, as described above, carbon powder 24 may be composed primarily of carbon milling waste 28 generated by machining a C—C composite component 25 and resin powder 26 may include coal tar or petroleum pitch that has been processed (e.g., mechanically ground) into powder form.

Vibrating fiber preform 12 (52) may be accomplished using any suitable technique. For example, fiber preform 12 may be placed in a container sized to accommodate fiber preform 12. Carbon powder 24 and resin powder 26 may be deposited on fiber preform 12 and the container, including its contents, may be placed on a shaker table for several minutes to allow carbon powder 24 and resin powder 26 to infiltrate interstitial spaces 19 of fiber preform 12. Additionally or alternatively, once on the shaker table, carbon powder 24 and resin powder 26 may be deposited on fiber preform 12 to allow the respective powders to infiltrate fiber preform 12. In some examples, fiber preform 12 may be vibrated at a frequency between about 25 hertz (Hz) and about 200 Hz, for example about 50 Hz. In some examples, high frequencies may be used.

A sufficient amount of carbon powder 24 and resin powder 26 should be applied to fiber preform 12 to allow the powders to infiltrate the preform. In some examples, this may be accomplished by maintaining a visual layer of powder mixture 14 on fiber preform 12 during the vibration assisted infiltration process. In some examples, additional powder mixture 14 may be deposited on fiber preform 12 during the vibration assisted infiltration process until sufficient infiltration of fiber preform 12 has been obtained.

The duration for which vibrational force 20 may be applied to fiber preform 12 may depend on a variety of factors including, for example, the size of the interstices (e.g., the interstitial spaces between the plurality of fibers of the fiber preform 12) of fiber preform 12 and the mesh size or powder mixture 14. In some examples, the appropriate duration for applying vibrational force 20 to fiber preform 14 may be experimentally determined by periodically weighing the infiltrated preform and tracking the weight of the infiltrated preform to determine if the weight of the infiltrated preform no longer increase by the application of steps (50) and (52). For example, the weight of the infiltrated preform may be taken over about 5-10 minute intervals to determine whether no substantial increase in the weight of infiltrated preform is observed. At which point, the infiltrated fiber preform 14 may be considered saturated by powder 14 and subjected to addition processing techniques (e.g., carbonization of resin powder 26). In some examples, a sufficient duration for which vibrational force 20 may be applied to fiber preform 12 may be about 5 to about 30 minutes.

FIG. 5 is another example technique to produce article 10 that includes machining 27 an exterior surface of a C—C composite component 25 to form a carbon powder 24 (60), mixing carbon powder 24 with a resin powder 26 to form a powder mixture 14 (62), and infiltrating interstitial spaces 19 between fibers 18 of a fiber preform 12 by depositing powder mixture 14 on a surface 16 of fiber preform 12 and applying a vibration 20 to fiber preform 12 (64).

As described above, machining 27 an exterior surface of a C—C composite component 25 to form a carbon powder 24 (60) may include a variety of different machining techniques such milling, turning, drilling, grinding, or the like. The machining 27 process may produce carbon milling waste 28. In some examples, the carbon milling waste 28 may be subsequently processed (e.g., further ground, screened/sieved, or the like) to produce at least a portion of carbon powder 24. In some examples, carbon powder 24 may be formed from primarily or entirely carbon milling waste 28. In some examples, carbon milling waste 28 may be produced from a C—C composite component 25 after the component has been subjected to graphitization (e.g., heat treatment).

Mixing carbon powder 24 with a resin powder 26 to form a powder mixture 14 (62) may be performed using any suitable technique. For example, carbon powder 24 and resin powder 26 may be combined in a container and mechanically mixed to form a homogenous mixture. In some examples, powder mixture 14 may be sieved to prior to infiltration to ensure the particles of powder mixture 14 are sufficiently sized.

The technique of FIG. 5 also includes infiltrating interstitial spaces 19 between fibers of a fiber preform 12 by depositing powder mixture 14 on a surface 16 of fiber preform 12 and applying a vibration 20 to fiber preform 12 (64). In some examples, the infiltration process (64) may be substantially the same as the infiltration process described in step (52) of FIG. 4. Any suitable order of depositing powder mixture 14 on a surface 16 of fiber preform 12 and applying a vibration 20 to fiber preform 12 may be used. For example, the vibrational force 20 may be applied to fiber preform 12 followed by the deposition of powder mixture 14 on an exterior surface 16 of fiber preform 12 until a desired saturation level is obtained. In some examples, powder mixture 14 may be deposited on exterior surface 16 of fiber preform 12, followed by application of vibrational force 20 to fiber preform 12. In another example, powder mixture 14 may be deposited on exterior surface 16 of fiber preform 12 before and during the application of vibrational force 20 to fiber preform 12.

FIG. 6 is another example technique to produce article 10 that includes mixing a resin powder 26 and carbon powder 24 to form a powder mixture 14 (76), depositing powder mixture 14 that includes carbon powder 24 and resin powder 26 on exterior surface 16 of fiber preform 12 (80), and applying a vibration 20 to fiber preform 12 to allow powder mixture 14 to infiltrating interstitial spaces 19 between fibers of a fiber preform 12 (82). In some examples, steps (76), (80), and (82) may be substantially the same (e.g., the same or nearly the same) as those describe with respect to FIGS.

4 and 5. As discussed above with respect to the techniques of FIG. 5, deposition step (80) and vibration step (82) may be performed in any suitable order to facilitate the infiltration of powder mixture 14 into fiber preform 12.

The technique of FIG. 6 also includes the optional step of machining 27 a surface of a C—C composite component 25 to remove excess carbon material (e.g., carbon milling waste 28) (70) and using the excess carbon material to form carbon powder 24 (72). In some examples, machining step (70) may be substantially the same those describe with respect to FIGS. 4 and 5. The machining step (70) may be substantially the same (e.g., the same or nearly the same) as machining step (60) described above with respect to FIG. 5. In some examples, the excess carbon material (e.g., carbon milling waste 28) produce by machining C—C composite component 25 may be used directly to form at least part of carbon powder 24 without the need for subsequent processing. In other examples, the excess carbon material may be subsequently processed, e.g., ground, screened, or the like, to form carbon powder 14.

The technique of FIG. 6 also includes the optional step of machining a resin material (e.g., coal tar or petroleum pitch) to form resin powder 26 (74). As described above, the resin material may be supplied in pellet form and initially machined (e.g., mechanically ground) to reduce the size of pellets to a desired mesh size to form resin powder 26, prior to being deposited on fiber preform 12. In some examples, the resin material used to form resin powder 26 may be machined in close temporal proximity to being deposited on fiber preform 12 to reduce the amount of resin material that may undergo oxidation prior to being infiltrated.

The technique of FIG. 6 also includes an optional step of applying an electrostatic charger to at least some of powder mixture 14 (78). The electrostatic charge may be applied to powder mixture 14 using any suitable technique. For example, the electrostatic charge may be created by a corona discharge. In some examples, the applied electrostatic charge may help reduce the production of dust (e.g., airborne powder mixture 14) generated during the vibration assisted infiltration process (82). Additionally or alternatively, the applied electrostatic charge may assist in adhering powder mixture 14 to fiber preform 12 to help retain powder mixture 14 within fiber preform 12.

The technique of FIG. 6 also includes an optional step heating the infiltrated fiber preform 12 to carbonize resin powder 26 (84). In some examples, the selection or resin material, the infiltrated fiber preform 12 may be heated to between about 500 degrees Celsius (° C.) and about 1000° C. to induce carbonization. In some examples, due to the presence of carbon powder 24, carbonization of resin powder 26 may occur without the need to subject the infiltrated fiber preform 12 to a stabilization cycle (e.g., induce crosslinking of the resin material) prior to carbonization.

Various examples have been described. These and other examples are within the scope of the following claims.

What is claimed is:

1. A method comprising:
   depositing a carbon powder and a resin powder on a surface of a fiber preform, wherein the fiber preform comprises a plurality of fibers and defines interstitial spaces between the plurality of fibers;
   wherein the plurality of fibers comprise carbon fibers or carbon precursor fibers; and
   vibrating the fiber preform to allow the carbon powder and the resin powder to infiltrate the interstitial spaces between the plurality of fibers of the fiber preform to form an infiltrated preform.

2. The method of claim 1, further comprising:
   mixing the carbon powder and the resin powder to form a powder mixture prior to depositing the carbon powder and the resin powder on the surface of the fiber preform.

3. The method of claim 2, wherein the powder mixture comprises at least about 10 weight percent (wt. %) of the carbon powder.

4. The method of claim 2, wherein the powder mixture defines a mesh size greater than about 18.

5. The method of claim 1, wherein the carbon powder and the resin powder comprise at least about 5 wt. % of the infiltrated preform.

6. The method of claim 1, further comprising heating the infiltrated preform to carbonize the resin powder to form a composite article.

7. The method of claim 1, further comprising:
   machining a surface of a carbon-carbon composite component to form a carbon milling waste; and
   using the carbon milling waste to form at least some of the carbon powder.

8. The method of claim 7, wherein using the carbon milling waste to form at least some of the carbon powder comprises sieving the carbon milling waste.

9. The method of claim 1, further comprising:
   machining a resin material to form the resin powder that defines a mesh size greater than about 18; and
   mixing the resin powder with the carbon powder to form a powder mixture.

10. The method of claim 9, further comprising:
    sieving the powder mixture prior to depositing the powder mixture on the surface of the fiber preform.

11. The method of claim 1, further comprising:
    applying an electrostatic charge to at least some of the carbon powder or the resin powder prior to depositing the carbon powder and the resin powder on the surface of the fiber preform, wherein the electrostatic charge is configured to cause the at least some of the carbon powder or the resin powder to be electrically attracted to the fiber preform.

12. A method comprising:
    machining an exterior surface of a carbon-carbon composite to form a carbon powder;
    mixing the carbon powder with a resin powder to form a powder mixture; and
    infiltrating interstitial spaces between fibers of a fiber preform by:
       depositing the powder mixture on a surface of the fiber preform; and
       vibrating the fiber preform;
    wherein the fibers of the fiber preform comprise carbon fibers or carbon precursor fibers.

13. The method of claim 12, further comprising applying an electrostatic charge to at least some of the powder mixture, wherein the electrostatic charge is configured to cause the at least some of the powder mixture to be electrically attracted to the carbon-carbon composite.

14. The method of claim 12, further comprising:
    machining a resin material to form the resin powder.

15. The method of claim 12, further comprising heating the infiltrated preform to carbonize the resin powder to form a composite article, wherein the infiltrated preform is not subjected to a resin stabilization cycle prior to carbonizing the resin powder.

* * * * *